(12) United States Patent
Chang

(10) Patent No.: US 8,614,496 B2
(45) Date of Patent: Dec. 24, 2013

(54) METHOD TO SCALE DOWN IC LAYOUT

(75) Inventor: Hsien-Chang Chang, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/347,711

(22) Filed: Jan. 11, 2012

(65) Prior Publication Data

US 2012/0110542 A1    May 3, 2012

Related U.S. Application Data

(62) Division of application No. 12/487,631, filed on Jun. 18, 2009, now abandoned.

(51) Int. Cl.
*H01L 21/70* (2006.01)

(52) U.S. Cl.
USPC ........... 257/499; 438/129; 438/599; 257/206; 257/401

(58) Field of Classification Search
USPC .......... 257/499, 206, 401, E27.013, E27.026, 257/E29.026, E29.027, E29.12, E23.07, 257/E23.151; 438/129, 599
See application file for complete search history.

(56) References Cited

U.S. PATENT DOCUMENTS

| | | | | |
|---|---|---|---|---|
| 4,970,564 A | * | 11/1990 | Kimura et al. | 257/306 |
| 5,081,515 A | * | 1/1992 | Murata et al. | 257/758 |
| 5,583,788 A | * | 12/1996 | Kuribayashi | 716/129 |
| 5,760,476 A | * | 6/1998 | Varker et al. | 257/767 |
| 6,097,073 A | | 8/2000 | Rostoker | |
| 6,271,081 B2 | * | 8/2001 | Kajiyama | 438/243 |
| 6,271,548 B1 | | 8/2001 | Umemoto | |
| 6,407,434 B1 | | 6/2002 | Rostoker | |
| 6,570,206 B1 | * | 5/2003 | Sakata et al. | 257/296 |
| 6,591,409 B2 | * | 7/2003 | Kamath et al. | 716/112 |
| 6,646,303 B2 | * | 11/2003 | Satoh et al. | 257/321 |
| 6,720,606 B1 | * | 4/2004 | Nitayama et al. | 257/306 |
| 7,190,050 B2 | * | 3/2007 | King et al. | 257/622 |
| 7,208,423 B2 | * | 4/2007 | Hashimoto et al. | 438/717 |
| 7,224,020 B2 | * | 5/2007 | Wang et al. | 257/317 |
| 7,468,617 B1 | * | 12/2008 | Sengupta et al. | 326/82 |
| 7,493,582 B2 | * | 2/2009 | Komaki | 716/119 |
| 7,585,745 B2 | * | 9/2009 | Adachi et al. | 438/424 |
| 7,915,647 B2 | * | 3/2011 | Kato et al. | 257/210 |
| 8,174,868 B2 | * | 5/2012 | Liaw | 365/154 |
| 8,299,873 B2 | * | 10/2012 | Wang et al. | 333/161 |
| 8,391,041 B2 | * | 3/2013 | Okayama | 365/51 |

(Continued)

FOREIGN PATENT DOCUMENTS

CN    1855465 A    11/2006

*Primary Examiner* — Fernando L Toledo
*Assistant Examiner* — Mohammed Shamsuzzaman
(74) *Attorney, Agent, or Firm* — Winston Hsu; Scott Margo

(57) ABSTRACT

A method scales down an integrated circuit layout structure without substantially jeopardizing electronic characteristics of devices. First, a conductive line set includes a first conductive line and a second conductive line respectively passing through a first region and a second region. Second, a sizing-down operation is performed so that the first conductive line and the second conductive line respectively have a first region scaled-down line width, a first region scaled-down space and a first region scaled-down pitch in the first region as well as selectively have a second region original line width, a second region scaled-down space and a second region scaled-down pitch in the second region. The first region scaled-down line width and the second region original line width are substantially different from each other.

9 Claims, 4 Drawing Sheets

(56) References Cited

U.S. PATENT DOCUMENTS

| | | | |
|---|---|---|---|
| 2001/0000689 A1* | 5/2001 | Kajiyama | 365/149 |
| 2002/0158273 A1* | 10/2002 | Satoh et al. | 257/211 |
| 2003/0209766 A1 | 11/2003 | Blanchard | |
| 2005/0001271 A1* | 1/2005 | Kobayashi | 257/368 |
| 2005/0087874 A1* | 4/2005 | Hieda | 257/751 |
| 2005/0230751 A1* | 10/2005 | Ohta et al. | 257/347 |
| 2006/0006474 A1* | 1/2006 | Tsuboi | 257/369 |
| 2006/0120125 A1* | 6/2006 | Kajigaya et al. | 365/2 |
| 2007/0049010 A1* | 3/2007 | Burgess et al. | 438/633 |
| 2008/0073672 A1* | 3/2008 | Kato et al. | 257/209 |
| 2008/0141921 A1* | 6/2008 | Hinderks | 114/274 |
| 2008/0290470 A1* | 11/2008 | King et al. | 257/622 |
| 2009/0087756 A1* | 4/2009 | Schulz | 430/5 |
| 2010/0127333 A1* | 5/2010 | Hou et al. | 257/368 |
| 2011/0042722 A1* | 2/2011 | Renn et al. | 257/208 |
| 2011/0111330 A1* | 5/2011 | Schultz et al. | 430/5 |
| 2011/0133822 A1* | 6/2011 | Mazure et al. | 327/537 |
| 2011/0147765 A1* | 6/2011 | Huang et al. | 257/77 |
| 2012/0038005 A1* | 2/2012 | Burgess et al. | 257/401 |
| 2012/0075903 A1* | 3/2012 | Watanabe et al. | 365/72 |
| 2012/0273899 A1* | 11/2012 | Wann et al. | 257/401 |

* cited by examiner

METHOD TO SCALE DOWN IC LAYOUT

CROSS REFERENCE TO RELATED APPLICATIONS

This application is a divisional application of and claims the benefit of U.S. patent application Ser. No. 12/487,631, filed Jun. 18, 2009.

BACKGROUND OF THE INVENTION

1. Field of the Invention

The present invention generally relates to a circuit layout structure and a method to scale down an integrated circuit layout. In particular, the present invention relates to a circuit layout structure with substantially different regional line width as well as a method to scale down an integrated circuit layout without substantially jeopardizing the electronic characteristics of devices.

2. Description of the Prior Art

In order to accommodate most semiconductor devices on a limited chip area to lower down the production cost, persons skilled in the art come up with many semiconductor methods to make the size of the devices smaller and smaller so as to make the IC density greater and greater. On one hand, smaller devices facilitate the operational speed, and on the other hand smaller devices reduce the power consumption of the devices. Accordingly, various solutions to scale down the circuit layout structure are practiced by persons skilled in the art.

Generally speaking, scaling down devices after the scale-down requires a substantially change in the IC layout. In such a way, even a simplest scale-down procedure makes the IC layout no longer useful and a new IC layout must be redesigned. It is well known that the design of the IC layout is very expensive and time-consuming.

In order to avoid all the costs for redesigning the IC layout, a method to directly scale down an original IC layout to obtain an IC layout of the required shrunk size has been proposed. However, such method universally scales down every dimension of the devices, so the size of the gate conductor layer is shrunk, too. But, the size of the gate conductor layer is closely related to the performance of the device. The change of the size of the gate conductor layer means the change of the performance of the device, too. Such change may possibly make the device no longer workable due to the excessive deviation of the performance of the device.

Although the current method directly scales down an original IC layout, it also changes the electronic characteristics of the device and may possibly make the device no longer workable. Consequently, a novel method is needed to scale down an integrated circuit layout without substantially jeopardizing the electronic characteristics of devices involved.

SUMMARY OF THE INVENTION

The present invention therefore proposes a novel circuit layout structure as well as a novel method not only to scale down an integrated circuit layout but also to maintain its electronic characteristics.

The present invention first proposes a circuit layout structure. The circuit layout structure of the present invention includes a substrate with a first region and a second region, and a set of conductive lines. The set of conductive lines includes at least a first conductive line and a second conductive line which respectively pass through the first region and the second region. There is variable space between the first conductive line and the second conductive line. The first conductive line and the second conductive line selectively have a first region line width and a second region line width so that the first region line width and the second region line width are substantially different. Because the first region line width and the second region line width are substantially different, not only is the integrated circuit layout scaled down but also the original electronic characteristics are maintained.

The present invention further proposes a method to scale down an integrated circuit layout structure without substantially jeopardizing electronic characteristics of devices. First a circuit layout including a set of conductive lines is provided. The conductive line set includes a first conductive line and a second conductive line which respectively pass through a first region and a second region. The first conductive line and the second conductive line in the first region selectively have a first region original line width, a first region original space and a first region original pitch and in the second region selectively have a second region original line width, a second region original space and a second region original pitch. Second, a sizing-down operation is performed so that the first conductive line and the second conductive line are respectively in accordance with a first region rule and with a second region rule so as to selectively have a first region scaled-down line width, a first region scaled-down space and a first region scaled-down pitch in the first region as well as selectively have a second region original line width, a second region scaled-down space and a second region scaled-down pitch in the second region. The first region scaled-down line width and the second region original line width are substantially different from each other.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 5-7 illustrate a preferred example of the circuit layout structure of the present invention.

DETAILED DESCRIPTION

Figure 1:
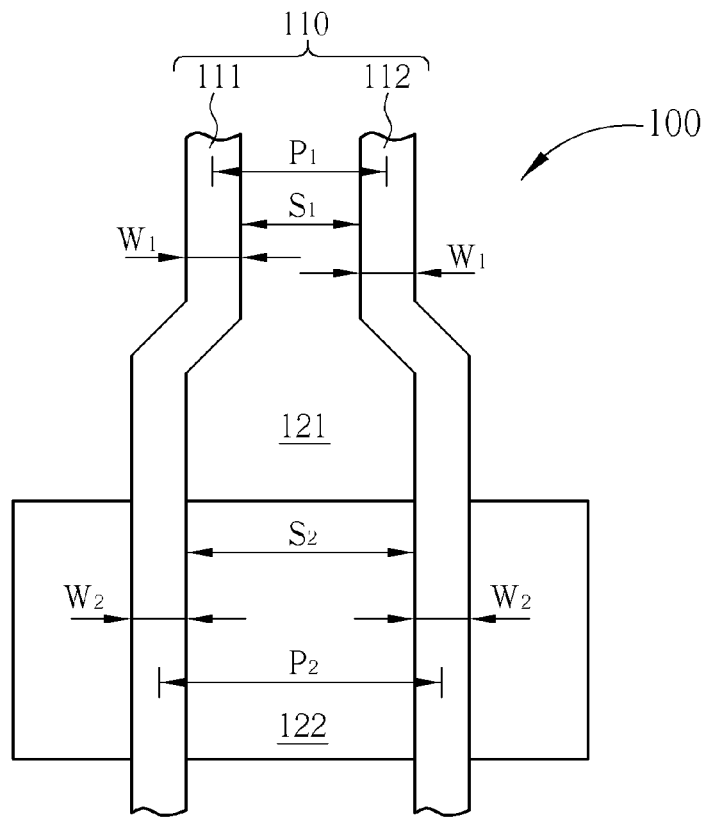
FIGS. 1-5 illustrate the method of the present invention to scale down an integrated circuit layout structure without substantially jeopardizing electronic characteristics of devices.

The present invention first provides a method to scale down an integrated circuit layout structure without substantially jeopardizing electronic characteristics of devices. FIGS. 1-5 illustrate the method of the present invention to scale down an integrated circuit layout structure without substantially jeopardizing electronic characteristics of devices. First, as shown in FIG. 1, a circuit layout 100 intended to be formed on a wafer is provided. The pre-determined pattern in the circuit layout 100 includes a set of conductive line patterns which may be saved in a database. The pre-determined conductive line pattern 110, i.e. the conductive line set 110, includes a first conductive line pattern 111 and a second conductive line pattern 112, called the first conductive line 111 and the second conductive line 112 for short.

The first conductive line 111 and the second conductive line 112 in the conductive line set 110 are pre-determined to respectively pass through a first region 121 and a second region 122 on a wafer. The first region 121 may be an insulting region such as a shallow trench isolation (STI) region or a field oxide region, and the second region 122 may be an active area (AA) such as a MOS region or a device region. When the first conductive line 111 and the second conductive line 112 pass through the second region 122, the first conductive line 111 and the second conductive line 112 in the second region 122 may be deemed as gates of certain semiconductor devices (not shown).

In FIG. 1, on one hand the first conductive line 111 and the second conductive line 112 in the first region 121 selectively have a first region original line width W1, a first region original space S1 and a first region original pitch P1 before the sizing-down operation and on the other hand in the second region 122 the first conductive line 111 and the second conductive line 112 selectively have a second region original line width W2, a second region original space S2 and a second region original pitch P2.

The line width, the space and the pitch altogether in any circumstances have the following relationship:

LINE WIDTH+SPACE=PITCH

For example, the line width increases when the space decreases if the pitch stays the same. For illustrative purpose, assume W1 is 0.18 μm, S1 is 0.24 μm, P1 is 0.42 μm, W2 is 0.18 μm, S2 is 0.28 μm and P2 is 0.46 μm for a given 0.18 μm process.

Next, a sizing-down operation is performed on the first conductive line 111 and on the second conductive line 112 in order to let the first conductive line 111 and the second conductive line 112 in the first region 121 and the second region 122 selectively have suitable sizes. For example, the sizing-down operation may be performed in the preliminary preparation of a reticle pattern or during an optical proximity correction (OPC). On one hand, the scaled-down size of the conductive lines may decrease the size of the devices and simultaneously increase the device density on the chip, and on the other hand, the unchanged parts of the conductive lines may maintain the electronic characteristics of the devices before the sizing-down operation. The sizing-down operation on the dimension of the first conductive line 111 and on the second conductive line 112 may be in accordance with an optional first region rule and with an optional second region rule.

Later, the sizing-down operation is performed in accordance with the first region rule and with the second region rule so that the first conductive line 111 and the second conductive line 112 selectively have a first region scaled-down line width w1, a first region scaled-down space s1 and a first region scaled-down pitch p1 in the first region 121 as well as selectively have a second region original line width W2, a second region scaled-down space s2 and a second region scaled-down pitch p2 in the second region 122. The first region scaled-down pitch p1 and the first region original pitch P1 are substantially different. Because the sizing-down operation is performed in accordance with the pre-determined first region rule and with the pre-determined second region rule, usually the first region rule is smaller than the second region rule, and the first region scaled-down line width w1 and the second region original line width W2 are substantially different. For example, the first region line width is smaller than the second region line width, and preferably the first region scaled-down line width w1 is smaller than the second region original line width W2. Moreover, the second region scaled-down space s2 is smaller than the second region original space S2 and the second region scaled-down pitch p2 is smaller than the second region original pitch P2.

Figure 3:
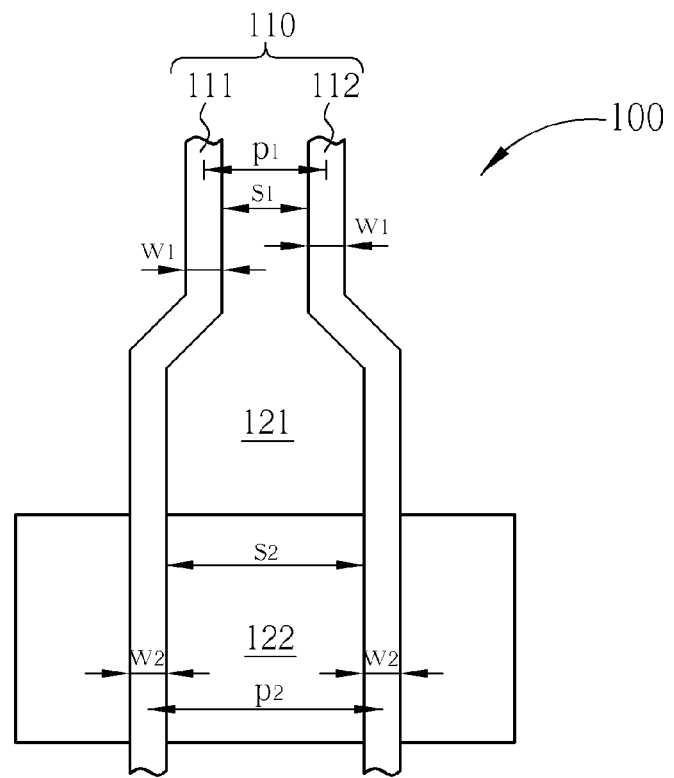

In a first preferred example of the present invention, the above-mentioned sizing-down operation may include two separate steps: a preliminary sizing-down operation and a sizing-up operation. For example, first, as shown in FIG. 3, the preliminary sizing-down operation is performed. The preliminary sizing-down operation on the first conductive line 111 and on the second conductive line 112 will make all the line width, the space and the pitch scaled down at the same ratio, 90% for instance. Accordingly, the first conductive line 111 and the second conductive line 112 in the first region 121 selectively have the first region scaled-down line width w1, the first region scaled-down space s1 and the first region scaled-down pitch p1 and selectively have a second region scaled-down line width w2 and the second region scaled-down pitch p2 in the second region 122.

Figure 2:
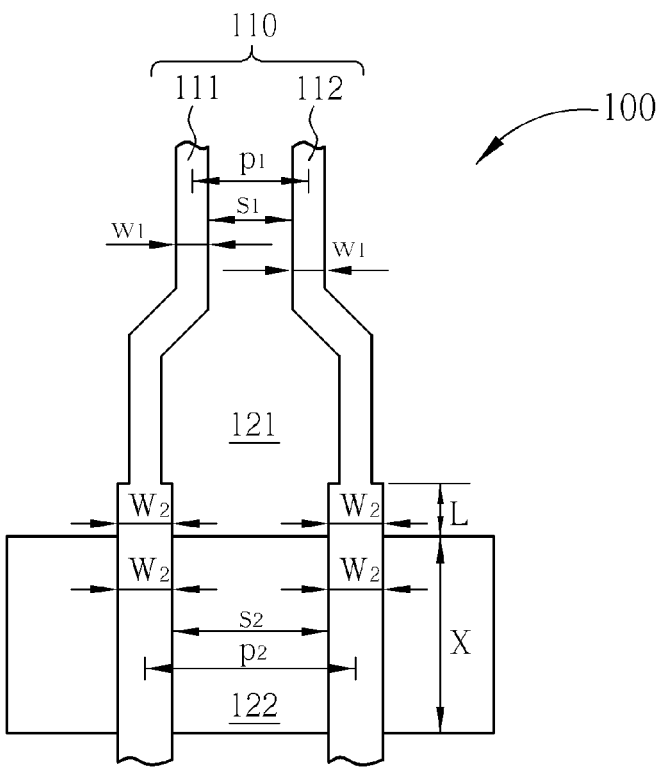

Afterward, as shown in FIG. 2, the sizing-up operation is performed to restore the second region scaled-down line width w2 in the second region 122 to the second region original line width W2 and to obtain the second region scaled-down space s2.

In a second preferred example of the present invention, the above-mentioned sizing-down operation may include three separate steps: a preliminary sizing-down operation, a preliminary sizing-up operation and a finish sizing-down operation. For example, first, as shown in FIG. 3, the preliminary sizing-down operation is performed. The preliminary sizing-down operation on the first conductive line 111 and on the second conductive line 112 will make all the line width, the space and the pitch scaled down at the same ratio, for instance 90%. Accordingly, the first conductive line 111 and the second conductive line 112 in the first region 121 selectively have the first region scaled-down line width w1, the first region scaled-down space s1 and the first region scaled-down pitch p1 and selectively have a second region scaled-down line width w2 and the second region scaled-down pitch p2 in the second region 122.

Figure 4:
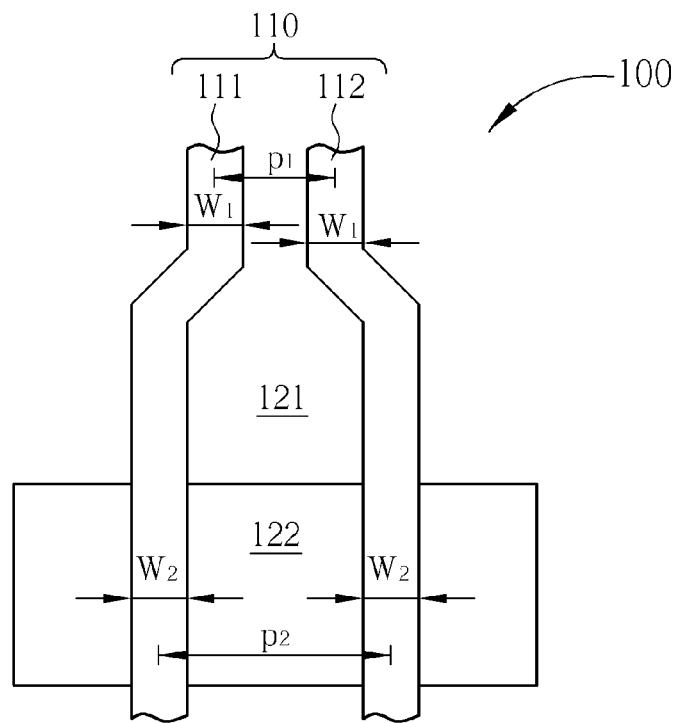

Then, a preliminary sizing-up operation is performed, as shown in FIG. 4, so that the line width of the first conductive line 111 and the second conductive line 112 in the conductive line set 110 respectively restore to the first region original line width W1 and the second region original line width W2. Please note the pitch of the first conductive line 111 and the second conductive line 112 remains unchanged as p1 and p2 regardless of the preliminary sizing-up operation.

Later, as shown in FIG. 2, a finish sizing-down operation is performed in the first region 121 to obtain the first region scaled-down line width w1 and the first region scaled-down space s1. Similarly, the pitch of the first conductive line 111 and the second conductive line 112 remains unchanged as p1 and p2 regardless of the finish sizing-down operation.

Given the above, the circuit layout 100 as shown in FIG. 1 to be formed on a wafer in the end selectively has the first region scaled-down line width w1, the first region scaled-down space s1 and the first region scaled-down pitch p1 in the first region 121 and selectively has the second region original line width W2, the second region scaled-down space s2 and the second region scaled-down pitch p2 in the second region 122. As a consequence, after the procedures of the method of the present invention, even though the scaled-down size of the conductive lines decreases the size of the devices and simultaneously increases the device density on the chip, the unchanged line width W2 in the second region 122 maintains the original electronic characteristics of the devices unchanged before the sizing-down operation. So far, the well-adjusted circuit layout 100 can be output onto a reticle (not shown) to obtain a useful reticle.

Figure 5:
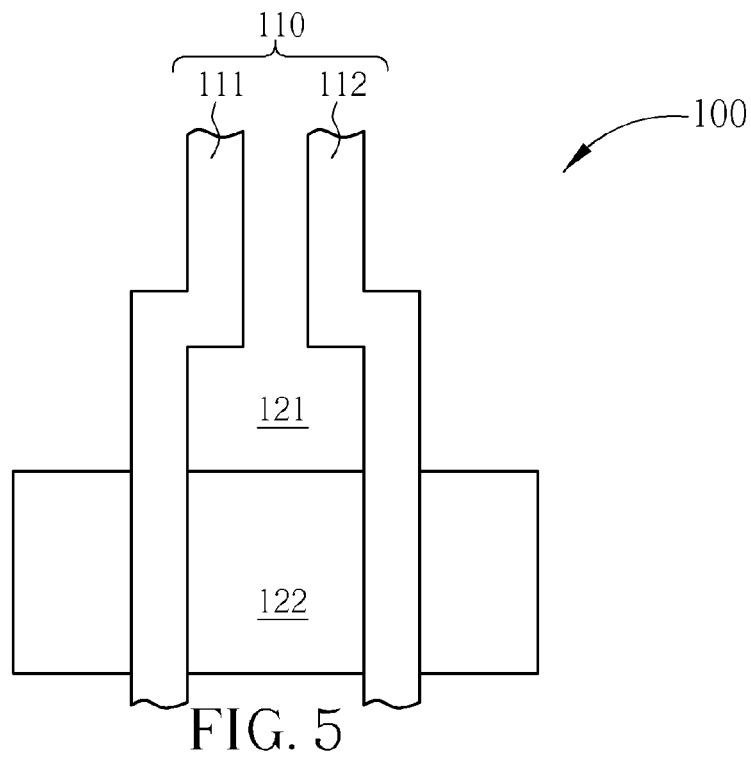

In one embodiment of the present invention, as shown in FIG. 1, the conductive line set 110 may have at least one 45 degree turn in the first region 121 because the conductive line set 110 respectively has the same line width in the first region 121 and in the second region 122. On the other hand, in another embodiment of the present invention, as shown in FIG. 5, the conductive line set 110 may have at least one 90 degree turn in the first region 121.

In one preferred embodiment of the present invention, the conductive line set 110 in the first region 121 may have different line width. For example, please refer to FIG. 2, the first conductive line 111 and the second conductive line 112 selectively have the second region original line width W2 of a pre-determined length L in the first region 121 adjacent to the second region 122. The pre-determined length L may be between ⅓-1 of a channel width X determined by the set 110 of conductive lines passing through the second region 122. Preferably, the pre-determined length L may be between ½-⅔ of the channel width X.

Figure 6:
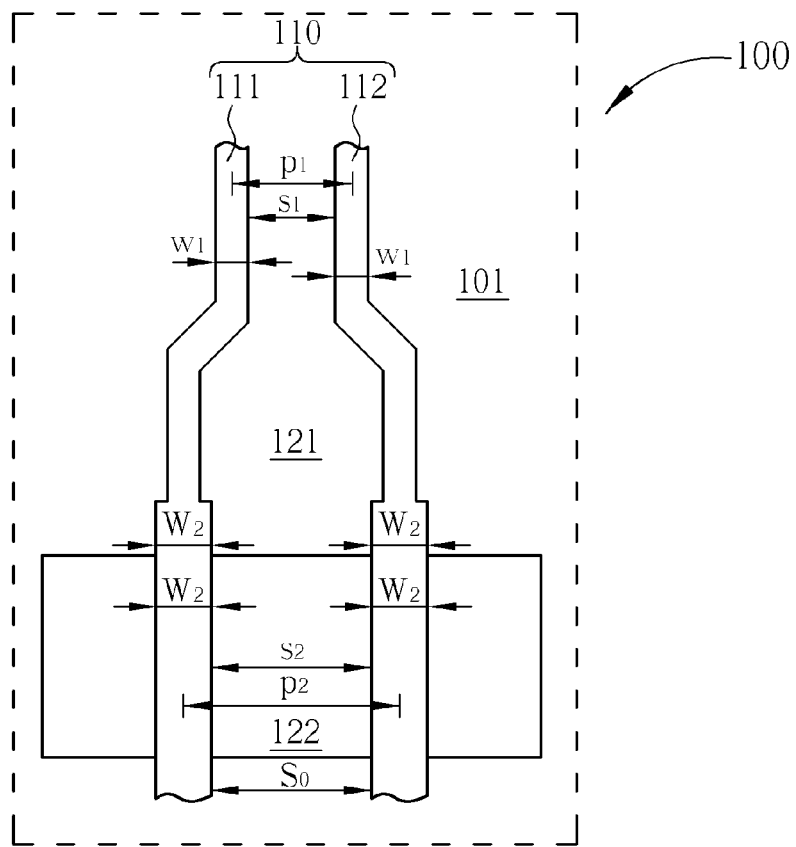
Figure 7:
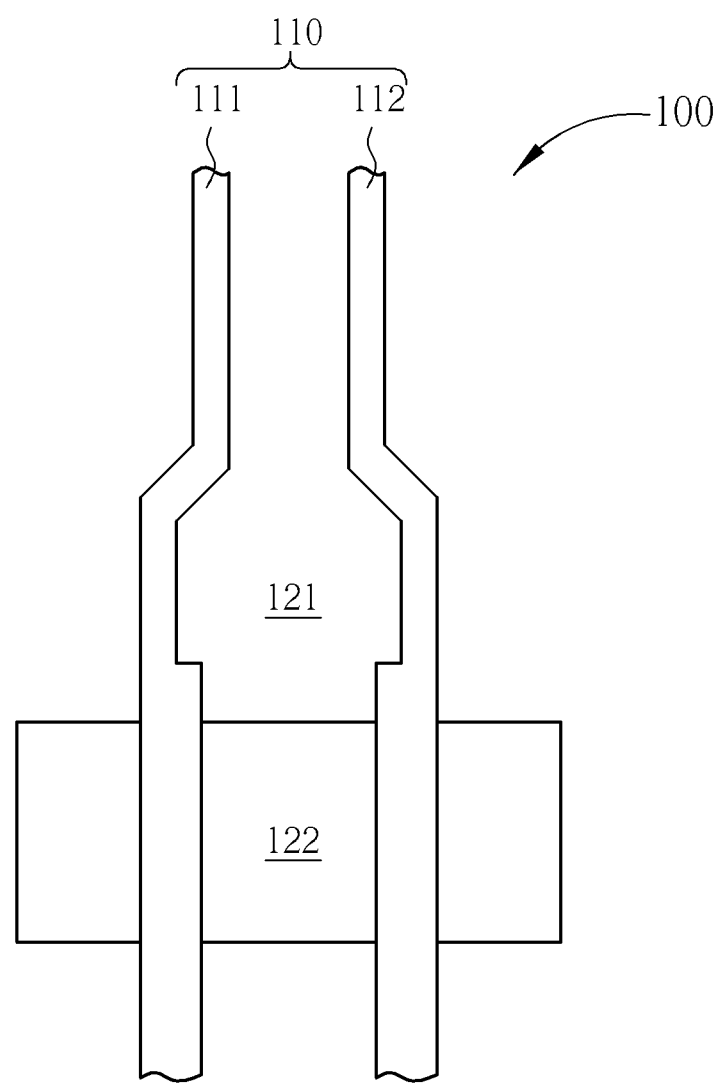

After the method to scale down an integrated circuit layout structure without substantially jeopardizing electronic characteristics of devices of the present invention, a useful reticle is therefore obtained. A circuit layout structure can be formed on a substrate using the useful reticle by means of the exposure and the development of a photoresist along with the etching and film deposition of the substrate. FIGS. 5-7 illustrate a preferred example of the circuit layout structure of the present invention. First, please refer to FIG. 6, the circuit layout structure 100 of the present invention is determined to be formed on a substrate 101. The substrate 101 may usually be a semiconductor material, such as silicon. The substrate 101 may include various regions, such as a first region 121 and a second region 122. The first region 121 may be an insulting region such as a shallow trench isolation (STI) region or a field oxide region, and the second region 122 may be an active area (AA) such as a MOS region or a device region.

A set of conductive lines 110 forms the conductive line set 110. The conductive line set 110 may include a first conductive line 111 and a second conductive line 112. The first conductive line 111 and the second conductive line 112 may respectively include a suitable conductive material, such as metal or doped polysilicon. The first conductive line 111 and the second conductive line 112 in the conductive line set 110 respectively pass through the first region 121 and the second region 122. When the first conductive line 111 and the second conductive line 112 pass through the second region 122, the first conductive line 111 and the second conductive line 112 in the second region 122 may be deemed as gates of certain semiconductor devices (not shown).

The first conductive line 111 and the second conductive line 112 may be in accordance with a first region rule and with a second region rule not necessarily always parallel with each other. For example, if the first region rule is different from the second region rule, there is variable space S0 between the first conductive line 111 and the second conductive line 112.

In addition, the line width of the first conductive line 111 and the second conductive line 112 is not always the same. For example, any one of the first conductive line 111 and the second conductive line 112 may selectively have a first region line width w1 in the first region 121 and a second region line width W2 in the second region 122. The first region line width w1 and the second region line width W2 are substantially different. Preferably, the first region line width w1 is smaller than the second region line width W2.

On the other hand, due to the variable space S0, the first conductive line 111 and the second conductive line 112 may selectively have a first region space s1 in the first region 121 and a second region space s2 in the second region 122. Moreover, the first conductive line 111 and the second conductive line 112 may selectively have a first region pitch p1 in the first region 121 and a second region pitch p2 in the second region 122. When the first region rule is different from the second region rule, the first region space s1 may be smaller than the second region space s2, or the first region pitch p1 may be smaller than the second region pitch p2.

In a first embodiment of the present invention, as shown in FIG. 6, the conductive line set 110 may have at least one 45 degree turn in the first region 121. On the other hand, in another embodiment of the present invention, as shown in FIG. 5, the conductive line set 110 may have at least one 90 degree turn in the first region 121.

In a second embodiment of the present invention, the conductive line set 110 in the first region 121 may have different line width. For example, please refer to FIG. 6, the first conductive line 111 and the second conductive line 112 have a line width W2 other than first region line width w1 in the first region 121 adjacent to the second region 122.

In a third embodiment of the present invention, please refer to FIG. 7, even though the conductive line set 110 may have different line width in the first region 121 and in the second region 122, at least one side of the first conductive line 111 aligns with at least one side of the second conductive line 112. Preferably, the outer edges of the first conductive line 111 and the second conductive line 112 align with each other.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method to scale down an integrated circuit layout structure without substantially jeopardizing electronic characteristics of devices, comprising:
providing a circuit layout comprising a set of conductive lines comprising a first conductive line and a second conductive line which respectively pass through a first region and a second region, wherein said first conductive line and said second conductive line selectively have a first region original line width, a first region original space and a first region original pitch in said first region and selectively have a second region original line width, a second region original space and a second region original pitch in said second region;
performing a sizing-down operation so that said first conductive line and said second conductive line are respectively in accordance with a first region rule and with a second region rule to selectively have a first region scaled-down line width, a first region scaled-down space and a first region scaled-down pitch in said first region, and selectively have said second region original line width, a second region scaled-down space which is smaller than said second region original space and a second region scaled-down pitch which is smaller than said second region original pitch in said second region, wherein said first region scaled-down line width and said second region original line width are substantially different, and said first region scaled-down pitch is smaller than said first region original pitch; and
wherein said set of conductive lines have said second region original line width of a pre-determined length in said first region adjacent to said second region and having a turn in said first region;
wherein said first region line width is smaller than said second region line width in said first region adjacent to said second region.

2. The method of claim 1, wherein said sizing-down operation further comprises:

performing a preliminary sizing-down operation on said first conductive line and on said second conductive line so that all said line width, said space and said pitch are scaled down at the same ratio to obtain said first region scaled-down line width, said first region scaled-down space and said first region scaled-down pitch in said first region, and said second region scaled-down pitch in said second region; and performing a sizing-up operation on said first conductive line and on said second conductive line to obtain said second region original line width and said second region scaled-down space in said second region.

3. The method of claim 1, wherein said sizing-down operation further comprises:
performing a preliminary sizing-down operation on said first conductive line and on said second conductive line so that all said line width, said space and said pitch are scaled down at the same ratio; and
performing a preliminary sizing-up operation so that said set of conductive lines has said first region original line width and said second region original line width; and performing a finish sizing-down operation to obtain said first region scaled-down line width and said first region scaled-down pitch in said first region.

4. The method of claim 1, wherein said first region is a shallow trench isolation region and said second region is an active area.

5. The method of claim 1, wherein said first region rule is smaller than said second region rule.

6. The method of claim 1, wherein said set of conductive lines has a 45 degree turn in said first region.

7. The method of claim 1, wherein said set of conductive lines has a 90 degree turn in said first region.

8. The method of claim 1, wherein said pre-determined length is between ⅓-1 of a channel width determined by said set of conductive lines passing said second region.

9. The method of claim 1, wherein said pre-determined length is between ½-⅔ of a channel width determined by said set of conductive lines passing said second region.

* * * * *